(12) United States Patent
Lebby

(10) Patent No.: US 10,574,025 B2
(45) Date of Patent: *Feb. 25, 2020

(54) HERMETIC CAPSULE AND METHOD FOR A MONOLITHIC PHOTONIC INTEGRATED CIRCUIT

(71) Applicant: Lightwave Logic Inc., Longmont, CO (US)

(72) Inventor: Michael Lebby, San Francisco, CA (US)

(73) Assignee: Lightwave Logic Inc., Englewood, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/881,718

(22) Filed: Jan. 26, 2018

(65) Prior Publication Data
US 2019/0237930 A1  Aug. 1, 2019

(51) Int. Cl.

| | | |
|---|---|---|
| *H01S 5/022* | (2006.01) | |
| *G02B 6/12* | (2006.01) | |
| *G02B 6/136* | (2006.01) | |
| *H01S 5/026* | (2006.01) | |
| *H01L 25/16* | (2006.01) | |
| *H01L 31/0203* | (2014.01) | |
| *H01L 31/0232* | (2014.01) | |
| *H01L 31/02* | (2006.01) | |

(52) U.S. Cl.
CPC ........ *H01S 5/0222* (2013.01); *G02B 6/12004* (2013.01); *G02B 6/136* (2013.01); *H01L 25/165* (2013.01); *H01L 25/167* (2013.01); *H01L 31/0203* (2013.01); *H01S 5/026* (2013.01); *G02B 6/12007* (2013.01); *H01L 31/02005* (2013.01); *H01L 31/02327* (2013.01)

(58) Field of Classification Search
CPC ........ H01S 5/0222; H01S 5/026; H01S 5/022; H01L 31/0203; H01L 31/02005; H01L 31/02327; H01L 31/02; H01L 31/0232; H01L 25/165; H01L 25/167; H01L 25/16; G02B 6/136; G02B 6/12004; G02B 6/12007; G02B 6/12
See application file for complete search history.

(56) References Cited

U.S. PATENT DOCUMENTS

| | | | | |
|---|---|---|---|---|
| 6,194,789 B1 * | 2/2001 | Zhou | ................ | H01L 23/06 257/787 |
| 6,227,724 B1 * | 5/2001 | Verdiell | ............... | G02B 6/4201 385/90 |
| 6,452,238 B1 * | 9/2002 | Orcutt | .................... | B81B 7/007 257/414 |

(Continued)

*Primary Examiner* — Andrew Jordan
(74) *Attorney, Agent, or Firm* — Parsons & Goltry; Robert A. Parsons; Michael W. Goltry

(57) ABSTRACT

A hermetic capsule including a semiconductor/metal base with sensitive semiconductor/polymer electrical and optical components formed thereon and a semiconductor/metal lid. The semiconductor/metal lid sealed to the semiconductor/metal base by metallization so as to form a chamber including all of the sensitive semiconductor/polymer electrical and optical components and hermetically sealing the chamber and all sensitive components from the ambient. External access to the sensitive semiconductor/polymer electrical and optical components is provided through a metallization.

10 Claims, 10 Drawing Sheets

(56) References Cited

U.S. PATENT DOCUMENTS

| | | | | |
|---|---|---|---|---|
| 6,458,263 B1* | 10/2002 | Morales | ............ | B81C 1/00666 205/118 |
| 6,647,185 B2* | 11/2003 | Hajjar | ............ | G02B 6/12004 385/14 |
| 6,743,656 B2* | 6/2004 | Orcutt | ............ | B81B 7/007 257/E23.193 |
| 6,786,654 B2* | 9/2004 | Kilian | ............ | G02B 6/4202 385/94 |
| 6,821,032 B2* | 11/2004 | Lake | ............ | G02B 6/4201 385/92 |
| 6,970,491 B2* | 11/2005 | Bhandarkar | ......... | G02B 6/4206 257/101 |
| 6,999,644 B1* | 2/2006 | Lebby | ............ | G02B 6/4201 385/14 |
| 7,352,923 B2* | 4/2008 | Mazed | ............ | H04B 10/40 385/14 |
| 7,824,806 B2* | 11/2010 | Visco | ............ | H01B 1/122 429/231.9 |
| 8,048,570 B2* | 11/2011 | Visco | ............ | H01B 1/122 429/231.9 |
| 8,404,388 B2* | 3/2013 | Visco | ............ | H01B 1/122 429/231.9 |
| 8,774,571 B2* | 7/2014 | Shinoda | ............ | G02F 1/13471 216/24 |
| 8,967,887 B2* | 3/2015 | Bowen | ............ | G02B 6/4251 385/88 |
| 9,130,198 B2* | 9/2015 | Visco | ............ | H01B 1/122 |
| 9,287,988 B2* | 3/2016 | Warren | ............ | H04B 10/503 |
| 9,513,380 B2* | 12/2016 | Liu | ............ | A61B 6/42 |
| 9,562,852 B1* | 2/2017 | Barwicz | ............ | G01N 21/39 |
| 9,612,409 B2* | 4/2017 | Finot | ............ | G02B 6/4201 |
| 9,625,379 B2* | 4/2017 | Barwicz | ............ | G01N 21/39 |
| 9,897,537 B2* | 2/2018 | Barwicz | ............ | G01N 21/39 |
| 10,162,111 B1* | 12/2018 | Lebby | ............ | G02B 6/4251 |
| 2002/0071637 A1* | 6/2002 | Centanni | ............ | G02B 6/2558 385/51 |
| 2002/0179986 A1* | 12/2002 | Orcutt | ............ | B81B 7/007 257/417 |
| 2002/0190106 A1* | 12/2002 | Iwai | ............ | B23K 35/3013 228/124.6 |
| 2003/0035606 A1* | 2/2003 | Hajjar | ............ | G02B 6/12004 385/2 |
| 2003/0068141 A1* | 4/2003 | Velsher | ............ | G02B 6/4248 385/92 |
| 2003/0081914 A1* | 5/2003 | Steinberg | ............ | G02B 6/421 385/94 |
| 2003/0165305 A1* | 9/2003 | Dallas | ............ | G02B 6/4201 385/92 |
| 2003/0223709 A1* | 12/2003 | Lake | ............ | G02B 6/4201 385/94 |
| 2004/0037519 A1* | 2/2004 | Kilian | ............ | G02B 6/4202 385/94 |
| 2004/0114884 A1* | 6/2004 | Shinde | ............ | G02B 6/4201 385/94 |
| 2004/0240804 A1* | 12/2004 | Mahapatra | ......... | G02B 6/4248 385/94 |
| 2006/0228078 A1* | 10/2006 | Chan | ............ | G01M 11/3109 385/92 |
| 2007/0037058 A1* | 2/2007 | Visco | ............ | H01B 1/122 429/246 |
| 2008/0182157 A1* | 7/2008 | Visco | ............ | H01B 1/122 429/50 |
| 2009/0154872 A1* | 6/2009 | Sherrer | ............ | G02B 6/4248 385/14 |
| 2010/0112454 A1* | 5/2010 | Visco | ............ | H01B 1/122 429/246 |
| 2011/0158273 A1* | 6/2011 | Okayama | ............ | B82Y 20/00 372/43.01 |
| 2013/0051725 A1* | 2/2013 | Shinoda | ............ | G02F 1/13471 385/14 |
| 2013/0224593 A1* | 8/2013 | Visco | ............ | H01B 1/122 429/218.1 |
| 2014/0103528 A1* | 4/2014 | Sakamoto | ......... | H01L 21/6835 257/737 |
| 2014/0162108 A1* | 6/2014 | Visco | ............ | H01M 4/13 429/131 |
| 2015/0086220 A1* | 3/2015 | Warren | ............ | H04B 10/503 398/200 |
| 2015/0360463 A1* | 12/2015 | Sadwick | ............ | H01J 23/165 347/110 |
| 2016/0027847 A1* | 1/2016 | Liu | ............ | A61B 6/42 378/62 |
| 2016/0028053 A1* | 1/2016 | Visco | ............ | H01B 1/122 429/405 |
| 2016/0035647 A1* | 2/2016 | Ochi | ............ | H01L 23/3677 257/690 |
| 2017/0016817 A1* | 1/2017 | Barwicz | ............ | G01N 21/39 |
| 2017/0016818 A1* | 1/2017 | Barwicz | ............ | G01N 21/39 |
| 2017/0016819 A1* | 1/2017 | Barwicz | ............ | G01N 21/39 |
| 2017/0063335 A1* | 3/2017 | Park | ............ | H04B 11/00 |
| 2017/0077900 A1* | 3/2017 | Park | ............ | H03H 9/706 |
| 2017/0082558 A1* | 3/2017 | Liu | ............ | A61B 6/4233 |
| 2017/0288645 A1* | 10/2017 | Park | ............ | H03H 3/02 |
| 2017/0294390 A1* | 10/2017 | Hettler | ............ | H01L 23/041 |
| 2018/0087726 A1* | 3/2018 | Yamashita | ......... | F21K 9/64 |
| 2018/0240757 A1* | 8/2018 | Wong | ............ | H01L 23/552 |
| 2019/0064436 A1* | 2/2019 | Leonberger | ......... | H01S 5/0268 |
| 2019/0079243 A1* | 3/2019 | Lebby | ............ | G02B 6/12002 |
| 2019/0148913 A1* | 5/2019 | Lebby | ............ | G02B 6/12004 372/50.11 |
| 2019/0204506 A1* | 7/2019 | Becker | ............ | G02B 6/1221 |
| 2019/0237930 A1* | 8/2019 | Lebby | ............ | H01S 5/0222 |

* cited by examiner

OVERALL DESIGN OF HERMETIC CAPSULE

CAPSULE LID PROCESS

INSIDE OF LID CAN BE LINED WITH EITHER HR OR AR COATING

HERMETIC CAPSULE AND METHOD FOR A MONOLITHIC PHOTONIC INTEGRATED CIRCUIT

FIELD OF THE INVENTION

This invention relates to hermetically sealed capsules encasing semiconductor/polymer chips and electro-optical components integrated on a common platform.

BACKGROUND OF THE INVENTION

Polymer modulators driven by semiconductor lasers are a popular apparatus for modulating a light beam. In a copending application entitled "Polymer Modulator and Laser Integrated on a Common Platform and Method", filed Aug. 31, 2017, with application Ser. No. 15/692,080, and incorporated herein by reference, the modulator and laser are integrated on a common platform, such as an InP chip or substrate.

A major problem that is present in the manufacture of such integrated circuits is that the semiconductor and polymer components will degrade or even fail when subjected to the moisture and gasses in the atmosphere. Prior art sealing methods generally include encapsulating the circuits in material that can be deposited over the entire circuit, such as silicon nitride or the like. This procedure introduces more problems in that the deposition generally requires high enough temperatures to damage the components. Also, it can be difficult to provide electrical contacts through the encapsulation and to provide optical pathways to allow optical communication through the encapsulation. Generally, attempts to reduce the encapsulation to allow electrical and optical communication, degrades the seal so that it is no longer hermetic, thereby causing eventual failure of the components.

It would be highly advantageous, therefore, to remedy the foregoing and other deficiencies inherent in the prior art.

Accordingly, it is an object of the present invention to provide a new and improved hermetic capsule for sealing electrical and/or optical components on a common platform.

It is another object of the present invention to provide a new and improved hermetic capsule sealing semiconductor lasers and polymer modulators integrated on a common platform.

It is another object of the present invention to provide a new and improved hermetic capsule sealing semiconductor lasers and polymer modulators integrated on a common platform with more efficient electrical and optical coupling to the exterior.

It is another object of the present invention to provide a new and improved hermetic capsule provided in a wafer scale solution that is cost effective.

SUMMARY OF THE INVENTION

Briefly to achieve the desired objects and advantages of the instant invention in accordance with a preferred embodiment a hermetic capsule is provided including a semiconductor/metal base and a semiconductor/metal lid. The base includes sensitive semiconductor/polymer electrical and optical components formed in/on a semiconductor/metal wafer. The semiconductor/metal lid is sealed to the semiconductor/metal base by metallization so as to form a chamber including all of the sensitive semiconductor/polymer electrical and optical components, hermetically sealing the chamber and all sensitive components from the ambient. External access to the sensitive semiconductor/polymer electrical and optical components is provided through a metallization.

To further achieve the desired objects and advantages of the present invention a specific embodiment of a hermetic capsule includes a semiconductor/metal base including sensitive semiconductor/polymer electrical and optical components fabricated in/on a semiconductor/metal wafer. The electrical and optical components of the base are fabricated on a first wafer of InP, GaAs, GaN, sapphire, or any combinations thereof. A semiconductor/metal lid is fabricated on a second wafer of the same material on which the base is fabricated. The lid is further fabricated in a shell-like form defining an internal volume surrounded by a peripheral edge. Metallization is deposited on the peripheral edges of the lid and on mating peripheral areas of the base. The semiconductor/metal lid is sealed to the semiconductor/metal base by the metallization so as to form a chamber including all of the sensitive semiconductor/polymer electrical and optical components and hermetically sealing the chamber and all sensitive components from the ambient. The metallization sealing the semiconductor/metal lid to the semiconductor/metal base also defines an optical pathway coupling an optical fiber connection to an optical component sealed within the chamber.

To further achieve the desired objects and advantages of the present invention a specific embodiment of a method of fabricating a hermetic capsule includes the steps of providing a first semiconductor/metal wafer and fabricating semiconductor/polymer electrical and optical components in the first semiconductor/metal wafer. Fabricating a semiconductor/metal lid in a shell-like form providing edges defining a volume space within the edges and hermetically sealing the edges of the semiconductor/metal lid to the semiconductor/metal base by metallization so as to form a chamber including all of the semiconductor/polymer electrical and optical components. The chamber hermetically sealing the semiconductor/polymer electrical and optical components from the ambient.

BRIEF DESCRIPTION OF THE DRAWINGS

Specific objects and advantages of the invention will become readily apparent to those skilled in the art from the following detailed description of a preferred embodiment thereof, taken in conjunction with the drawings in which.

DETAILED DESCRIPTION OF THE DRAWINGS

Figure 1:
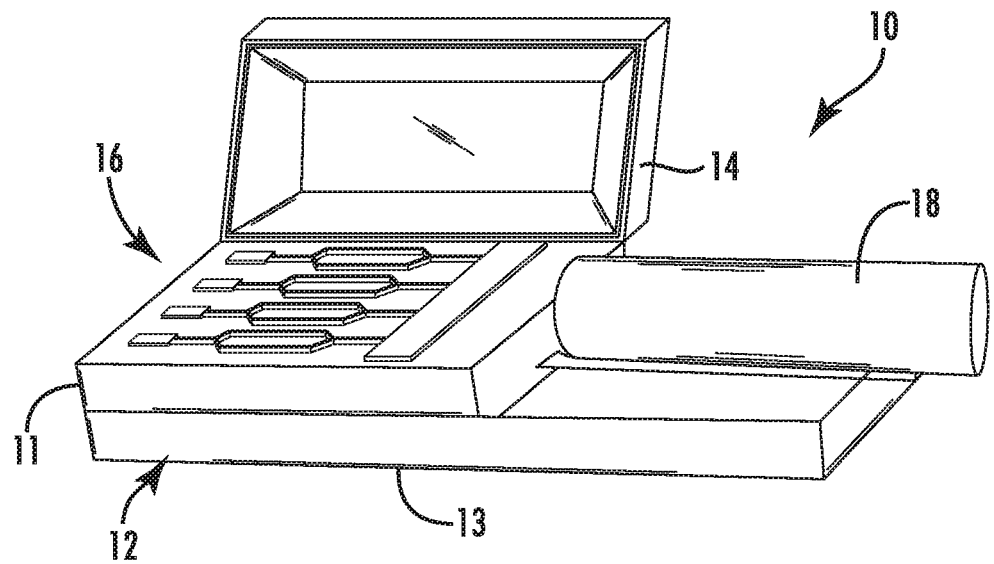
FIG. 1 is a perspective view of a hermetic capsule (in an open configuration to illustrate internal components) with integrated laser/polymer modulator, according to the present invention.

A primary object of the present invention is to provide a hermetically sealed capsule for sensitive laser and polymer modulators integrated on a common platform, although other uses are contemplated. An example of such components is the monolithic photonic integrated circuits described in copending patent application entitled "POLYMER MODULATOR AND LASER INTEGRATED ON A COMMON PLATFORM AND METHOD", filed Aug. 31, 2017, Ser. No. 15/692,080, and incorporated herein by reference. In this specific example, the common platform is single crystal InP, because lasers are naturally fabricated from InP and are already monolithic (part of the same material). It will be understood however, that the common platform could be InP, GaAs, GaN, sapphire, or any combinations thereof. Also, while the laser described herein is generally InP, it will be understood that the lasers could be GaAs, GaN, etc. As will also be understood from the following description, the modulators in this specific example are polymer based. Further, the optical connection between the laser and modulator, in this specific example, is either polymer waveguides, or semiconductor material waveguides matching the laser (i.e. InP waveguide with InP laser). Also, the optical connecting waveguides could be dielectric based, such as silicon dioxide, silicon nitride, etc.) Turning to FIG. 1, a hermetic capsule 10, including base 12 and lid 14, is illustrated with integrated laser/polymer modulator 16 and optical fiber 18 optically coupled to integrated laser/polymer modulator 16 to supply an optical output, according to the present invention. Hermetic capsule 10 is illustrated in an open configuration to show integrated laser/polymer modulator 16 and the coupling of optical fiber 18. In this disclosure, the "base" is defined as the structure carrying all of the electro-optic components, and is generally illustrated and discussed as a single platform. However, it will be understood that the base could be fabricated in a semiconductor/metal wafer, designated 11 in FIG. 1, which could in turn be mounted on a capsule platform, designated 13, in FIG. 1. Capsule platform 13 could be fabricated from silicon, GaAs, metal, plastic, or any other suitable organic or inorganic material which would serve to hold the semiconductor/metal wafer and optical fiber 18 in a fixed relationship. In applications where the base is mounted on a capsule platform, as illustrated in FIG. 1, some of the etching steps defining the right-hand edge of the base, described below, may not be needed.

Figure 2:
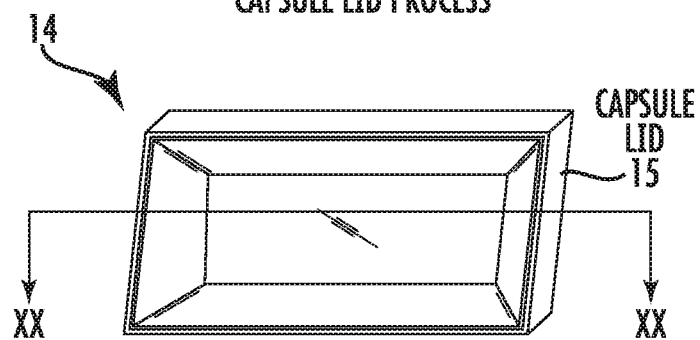
FIG. 2 is a perspective view of the lid of the hermetic capsule of FIG. 1, according to the present invention.
Figure 3A:
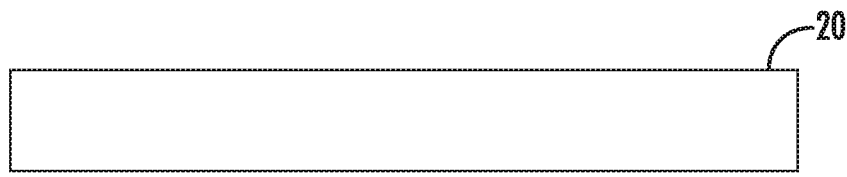
FIG. 3A through FIG. 3C illustrate several steps in a process for fabricating the lid of FIG. 2.
Figure 3B:
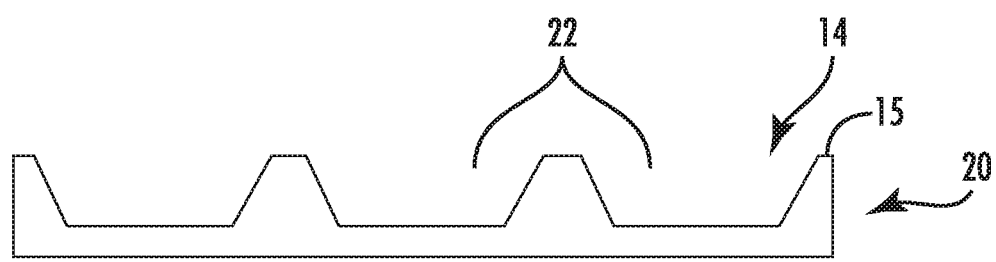
Figure 3C:
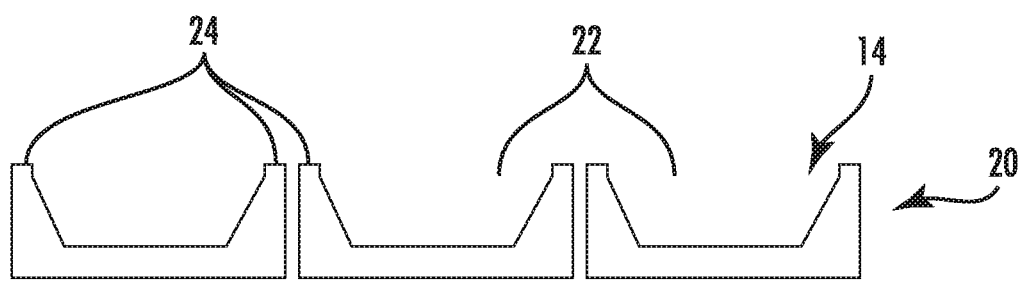

Referring to FIG. 2, lid 14 is illustrated individually to better show fabrication steps illustrated in FIG. 3a through 3C. In the preferred embodiment, lid 14 is fabricated from the same material as base 12 and in a shell-like form to define an internal volume surrounded by a peripheral edge 15. For example, base 12 is fabricated from InP so that the laser can be fabricated monolithically (i.e. on the same wafer), as described in more detail in the above described copending patent application. Further, since base 12 and lid 14 are formed of the same material, in the preferred embodiment, the coefficient of temperature expansion (CTE) will be the same. It should be understood, however, that other wafer materials, such as GaAs, GaN, silicon, sapphire, etc., could be used to fabricate base 12 and lid 14 and in some cases, depending upon the CTE, base 12 and lid 14 might be made of different material, to reduce cost or for other reasons.

Referring additionally to FIGS. 3A, 3b, and 3C, some steps in a process of fabricating lid 14 are illustrated. FIG. 3A illustrates a wafer 20 of the material selected for lid 14. In the process, as illustrated specifically in FIG. 3B, wafer 20 is masked, photolithographed and deep trenches 22 are etched in a two dimensional format. Well-known wet and dry etching techniques can be used. In this fashion an array of two-dimensional trenches 22 are formed across wafer 20. As will be understood by those skilled in the art, each trench 22 defines a lid 14 hollowed out (shell-like form) to provide a volume space within the confines of edge 15. The edges 15 of each trench 22 are metallized, designated by number 24, and the array of trenches 22 is singulated into individual lids 14, as illustrated in FIG. 3C. In addition to providing hermetic sealing of lid 14 to base 12, the metallization can be used for internal protection, lid lining, reflector applications, or could be a non-reflective lining for absorption of stray light and the like. In addition to or instead of metallization of the inside of each lid 14, the inside can be lined with either a high reflective (HR) or an antireflective (AR) coating.

In the specific example illustrated in FIG. 3C lids 14 are singulated before attachment to corresponding bases 12. However, in some applications it may be more convenient to align and then simultaneously bond multiple lids 14 still connected by the continuous material (e.g. as illustrated in FIG. 3B) to corresponding bases 12 (also formed in a matching array on a second wafer). The bonded bases/lids could then be singulated into individual components.

Figure 4A:
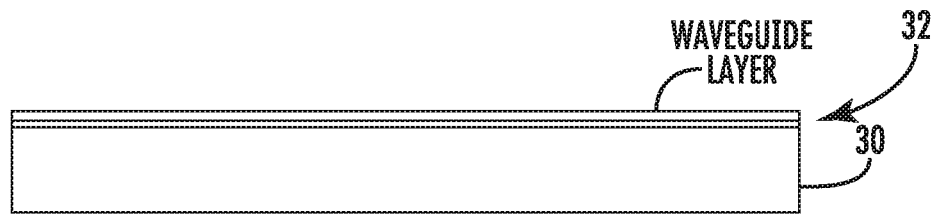
FIG. 4A through FIG. 4K illustrate steps in the process of fabricating an embodiment of the hermetic capsule of FIG. 1, according to the present invention.

Turning now to FIG. 4A through FIG. 4K, steps for fabricating base 12, including integrated laser/polymer modulator 16 and optical fiber 18 optically coupled to integrated laser/polymer modulator 16, are illustrated. While a single base 12 is illustrated for convenience of the viewer, it should be understood that an array of bases similar to that illustrated could be formed in a wafer so as to be aligned with the array of lids illustrated in FIG. 3B. To this end, FIG. 4A through FIG. 4K, can be considered to illustrate a single one of an array of bases. Referring specifically to FIG. 4A, a semiconductor wafer 30 is provided. Wafer 30 includes InP in the preferred embodiment because a laser diode can be fabricated monolithically as a source of light for the structure. The wafer can include GaAs, GaN, silicon, etc. In the case of GaAs and GaN, monolithic emitters (lasers or LEDs) can be formed monolithically but in the case of a silicon wafer, InP, GaAS, or GaN would be grown or bonded on the silicon wafer to provide for a monolithic emitter. With further reference to FIG. 4A, semiconductor wafer 30 is modified by the growth of epi layers 32 to define laser/waveguide structures. Some laser/waveguide structures that might be formed include, for example, quantum wells, waveguide cladding layers, highly and lightly doped N and P layers, waveguide barrier layers, etc. Many or all of these structures might include InP material systems, such as InGaAs, InGaP, InGaAlAs, InGaAlP, InAsGaP, etc.

Figure 4B:
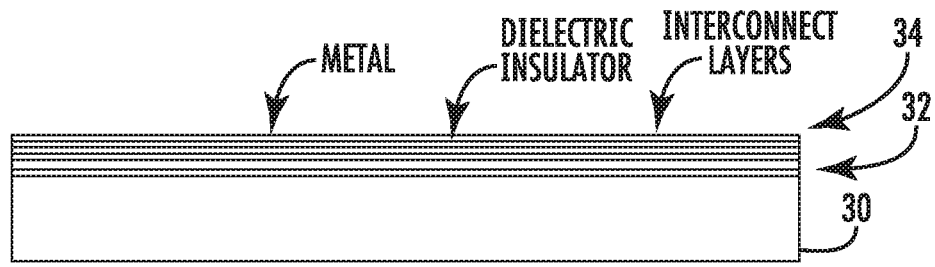

Referring specifically to FIG. 4B, semiconductor wafer 30 is further modified by depositing multiple layers of metal/dielectric material to define electrical interconnect layers 34 at the upper surface. Electrical interconnect layers 34 allow electrical signaling (e.g. rf, microwave, ac, dc, etc.) to pass between the integrated devices (see below) and the exterior for bonding and signaling.

Figure 4C:
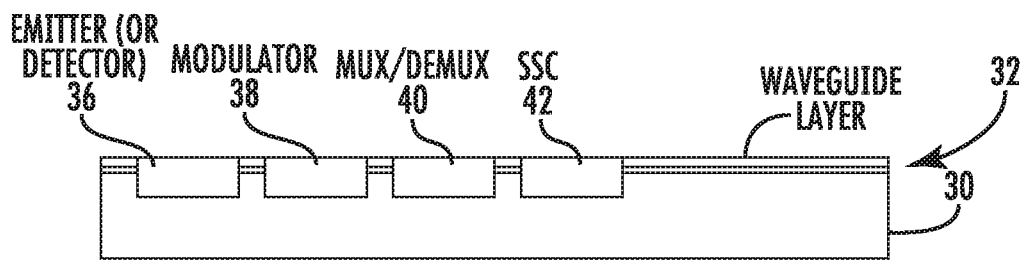

Referring specifically to FIG. 4C, photonic devices are fabricated into epi layers 32. In this preferred embodiment the photonic devices can include any or all of an emitter/detector 36, a modulator 38, a mux/demux device 40, and spot size converter 42. Also, emitter/detector 36, in the emitter form, preferably includes a laser, such as a distributed feedback (DFB) laser, a Fabry-Perot (FB) laser, a distributed Bragg reflector (DBR) laser, a tunable laser, a VCSEL (vertical cavity surface emitting laser), or any other type of semiconductor laser. Emitter/detector 36, in the detector form, preferably includes semiconductor diodes of the n-p, n-i-p, type or the like, which can be easily fabricated in the semiconductor/metal base. While the major components are listed above, the photonic devices can also include other components, such as modulators, detectors, mux, demux, waveguides, couplers, splitters, and spot size converters all in InP (in the preferred example). The modulator and at least some of the waveguide can be polymer based, e.g. a Mach-Zehnder structure.

Figure 4D:
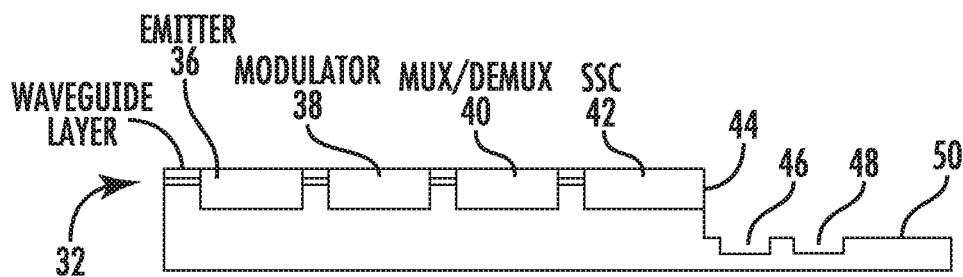
Figure 4E:
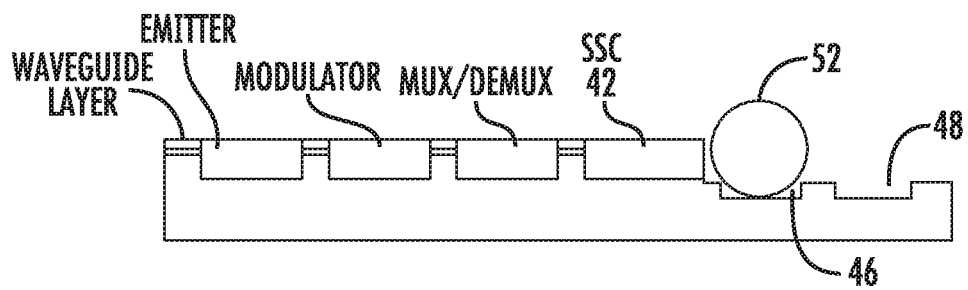
Figure 4F:
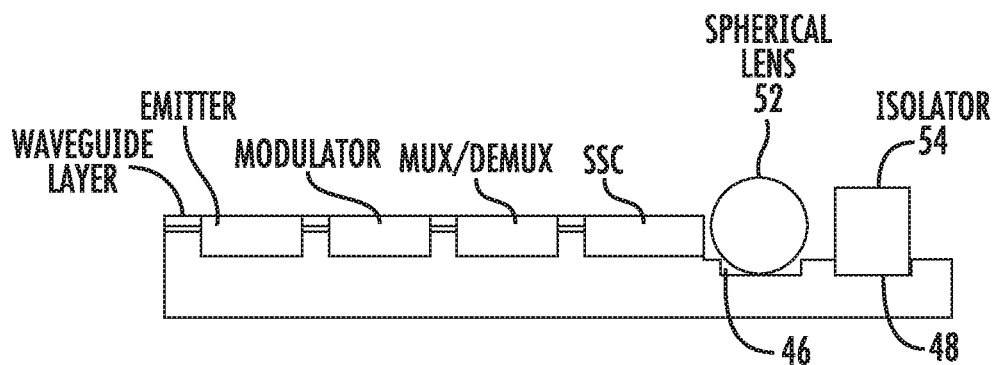

Referring specifically to FIG. 4D, semiconductor wafer 30 is fabricated for optical fiber alignment/placement and to allow for mounting of a spherical lens and/or an isolator. In this embodiment this is accomplished by etching semiconductor wafer 30 (at the right hand side in the figures) to expose the end 44 of spot size converter 42 and to form depressions 46 and 48 and an elongated V-shaped trench 50 for receiving an optical fiber therein. Referring additionally to FIG. 4E, a spherical lens 52 is fixedly mounted in depression 46 so as to be optically aligned with spot size converter 42. Referring additionally to FIG. 4F, an optical isolator 54 is fixedly mounted in depression 48 so as to be optically aligned with spherical lens 52. Optical isolator 54 allows optical signals to be collimated and aligned for delivery to an optical fiber.

Figure 4G:
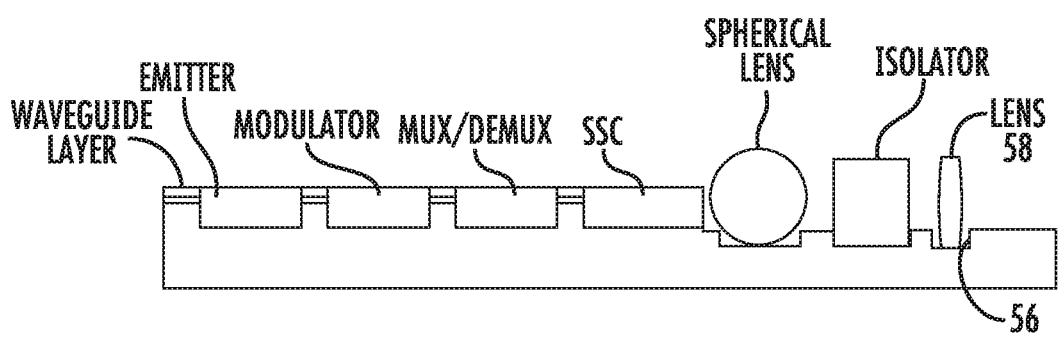
Figure 4H:
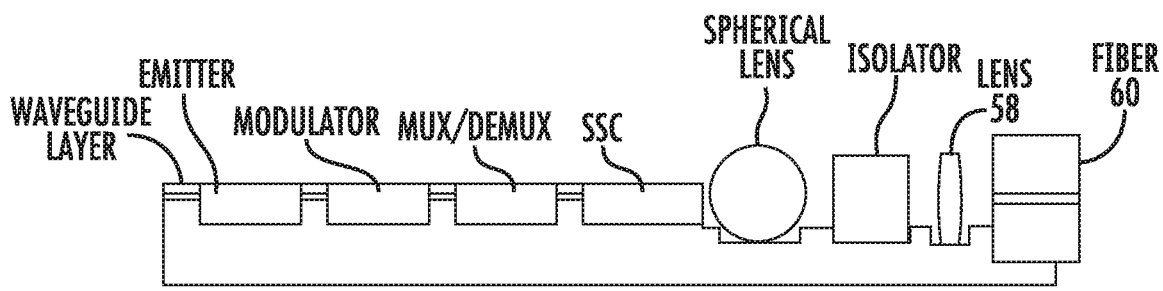

Referring additionally to FIG. 4G, an additional depression 56 is formed/etched adjacent the right hand end of semiconductor wafer 30 and an optical lens 58 is fixedly mounted therein in optical alignment with optical isolator 54. Optical lens 58 is designed to focus light to/from an optical fiber and allows optical signals to be more accurately aligned to an optical fiber. Referring additionally to FIG. 4H, one end of an optical fiber 60 is fixedly mounted in elongated V-shaped trench 50 so as to be optically aligned with optical lens 58. It will be understood that any or all of spherical lens 52, optical isolator 54, and optical lens 58 may or may not be included in any specific structure, depending upon application and other engineering factors (e.g. materials used, alignment required, etc.).

Figure 4I:
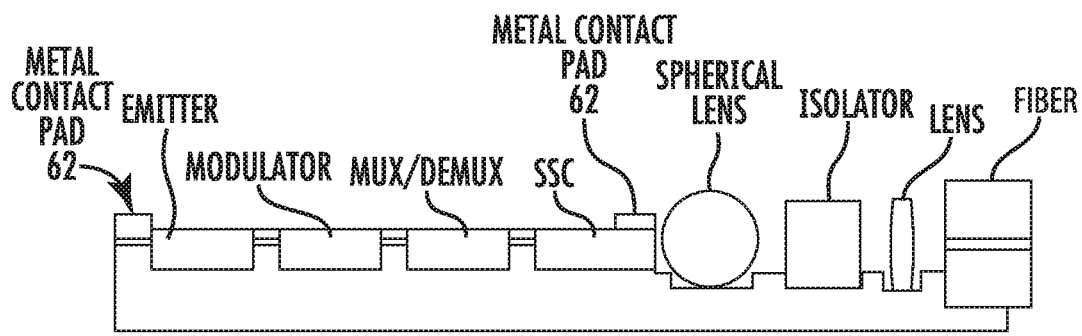
Figure 4J:
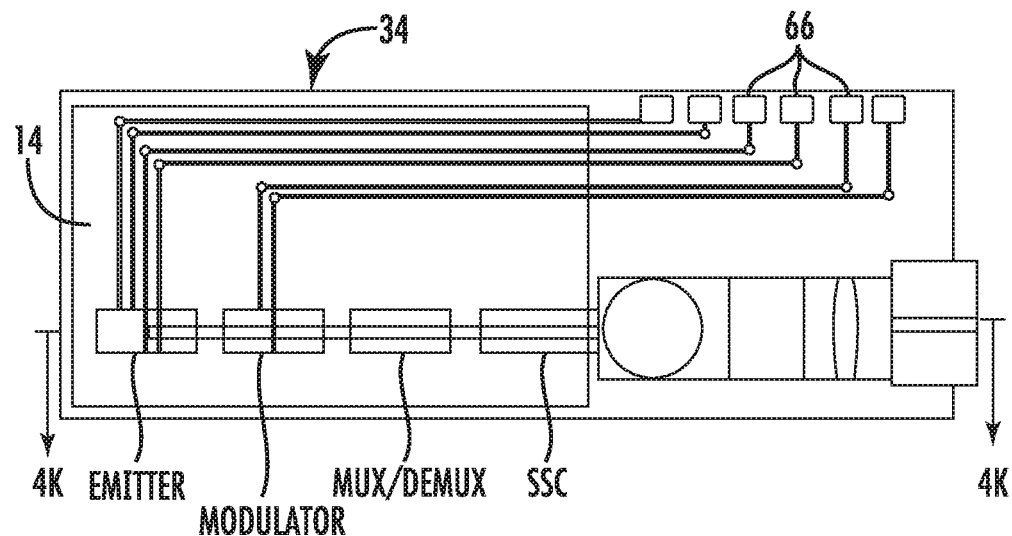
Figure 4K:
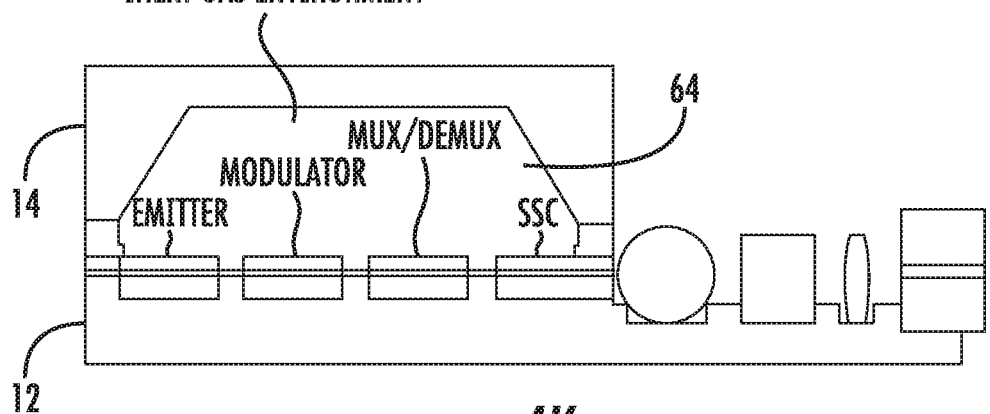

Turning to FIG. 4I, the structure of FIG. 4H is illustrated with metal contact pad 62 formed on the entire peripheral area (mating with edge 15 of lid 14), including spot size converter 42, so as to completely surround all of the photonic devices, including all of emitter/detector 36, modulator 38, mux/demux device 40, and spot size converter 42. Metallization of contact areas (or area) 62 is preferably performed by using evaporation, ebeam, or sputtering of the metal onto the designated surface. Referring additionally to FIG. 4J and FIG. 4K, lid (as metalized in FIG. 3C) is aligned and hermetically sealed to base 12 to encapsulate and hermetically seal all of the sensitive semiconductor/polymer components. In this context, the term "sensitive" is defined to include any components formed of material that can be affected by the ambient (e.g. semiconductor and polymer components) while standard components of glass, etc, (e.g. spherical lens 52, isolator 54, optical lens 58, and optical fiber 60) are not sensitive and are generally not encapsulated. The metalized sealing can be accomplished, for example, via laser, seam, bonding, alloying, etc. A chamber 64 formed by the union of base 12 and lid 14 is preferably filled with an inert gas (e.g. nitrogen, argon, etc.) which can be introduced by aligning and sealing lid 14 in an atmosphere of the chosen inert gas.

Referring again to FIG. 4J, the position of electrical interconnect layers 34 and the various optical components are illustrated in a top view of hermetic capsule 10 (even though they would be hidden by lid 14 and overlying material) to illustrate externally accessible electrical contacts or contact pads 66 and their connections to the electrical portions of emitter/detector 36 and modulator 38. The electrical lines formed in electrical interconnect layer 34 are buried in an insulating oxide or polymer layer or layers to avoid current leakage between adjacent lines and to avoid shorting to the metallization seal. Thus, it can be seen that hermetic capsule 10 hermetically encapsulates the various semiconductor/polymer components while allowing external electrical and optical access. In this specific embodiment, the metallization in area 62, along with spot size converter 42 defines an optical output pathway for connection to an external device, such as an optical fiber. The electrical interconnect layers 34 and externally accessible electrical contacts or contact pads 64 are applicable to all embodiments and capsule designs.

Figure 5A:
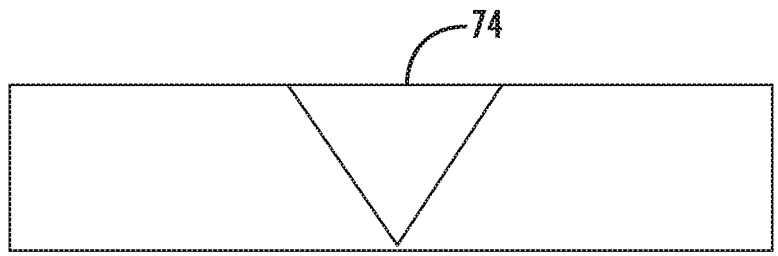
FIG. 5A through FIG. 5C illustrate steps in the process of fabricating a modification of the hermetic capsule of FIG. 1, according to the present invention.
Figure 5B:
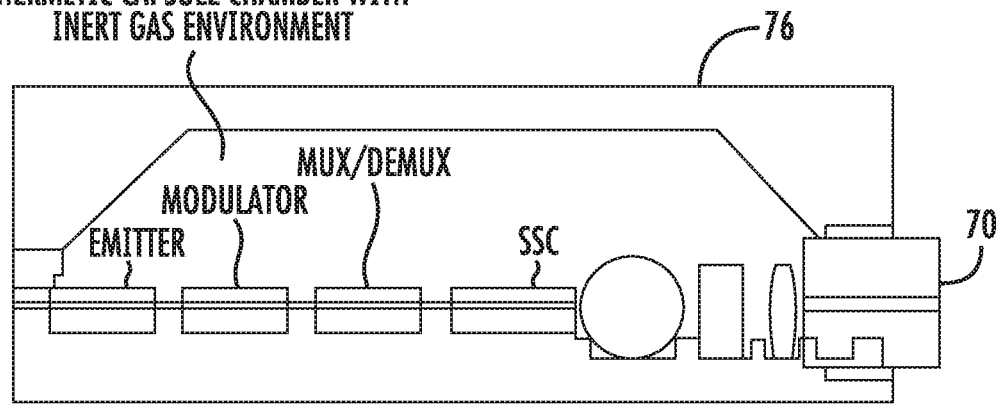
Figure 5C:
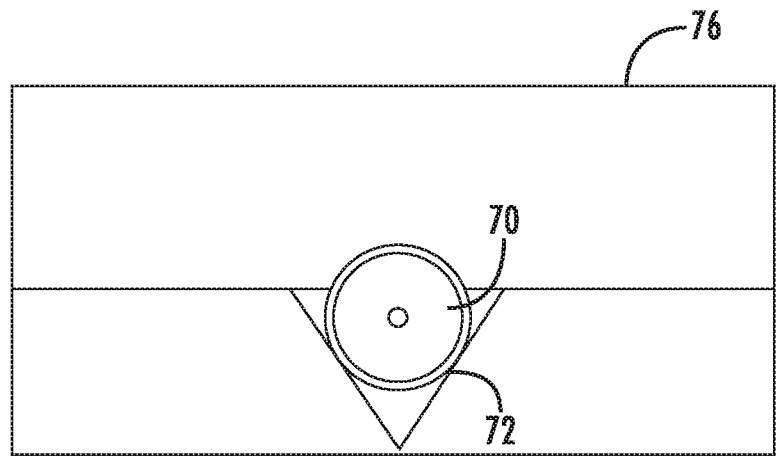

Turning to FIG. 5A, FIG. 5B, and FIG. 5C, a modification of the hermetic capsule 10 illustrated in FIG. 4K is illustrated. In this modified structure, a metallized optical fiber 70 is positioned in a V-shaped groove 74 (see FIG. 5A). Metallized optical fiber 70 has an outer metal coating 72 (see FIG. 5C) for at least the portion lying in V-shaped groove 74. A lid 76, which is modified to extend to the right hand edge (see FIG. 5B) is metallized, generally as explained above, and hermetically seals fiber 70 into the side of the hermetic capsule. This modified hermetic capsule allows the optical fiber-to-InP components to be optimized. Other than the modified lid and optical fiber, the structure remains the same as described above, with one other exception, the lid is also modified to allow external electrical connections (contact pads 66) to be accessed.

Figure 6:
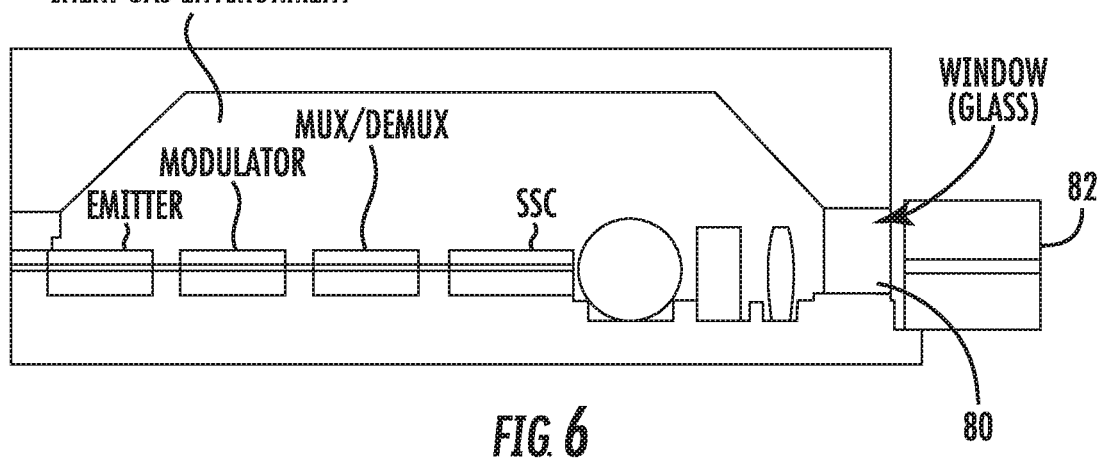
FIG. 6 illustrates another modification of the hermetic capsule of FIG. 1, according to the present invention.

Turning to FIG. 6, another modification of the hermetic capsule is illustrated. In this structure the base and lid are the same as illustrated in FIG. 5B but instead of enclosing a metalized optical fiber a window 80 is metalized and sealed in the right hand wall adjacent the right hand edge of the base. An optical fiber 82 is mounted in a V-groove at the right hand edge of the base and aligned to receive optical signals from the internal optics through window 80. Window 80 can be glass or any optically transparent material that preserves the hermetic seal.

Figure 7A:
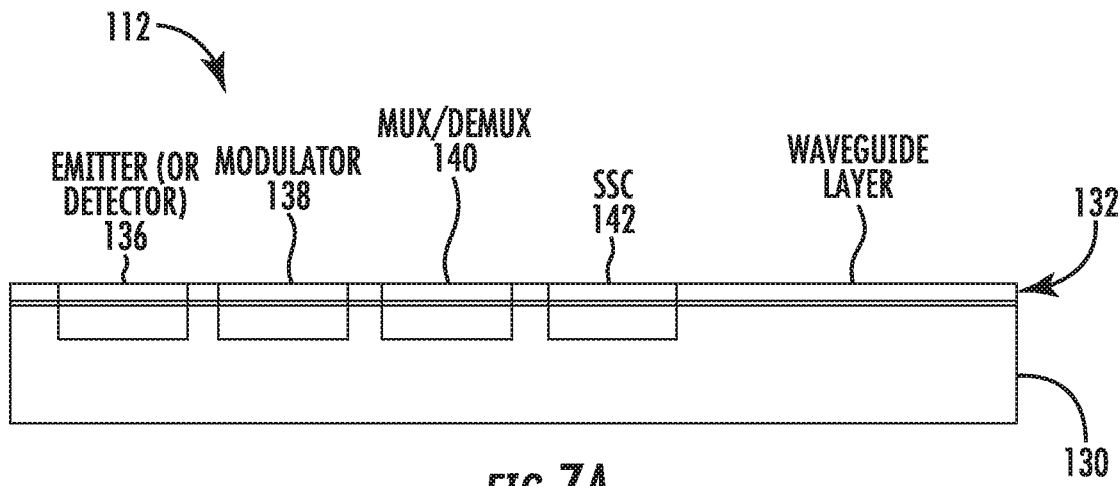
FIG. 7A through FIG. 7C illustrate steps in the process of fabricating another modification of the hermetic capsule of FIG. 1, according to the present invention.
Figure 7B:
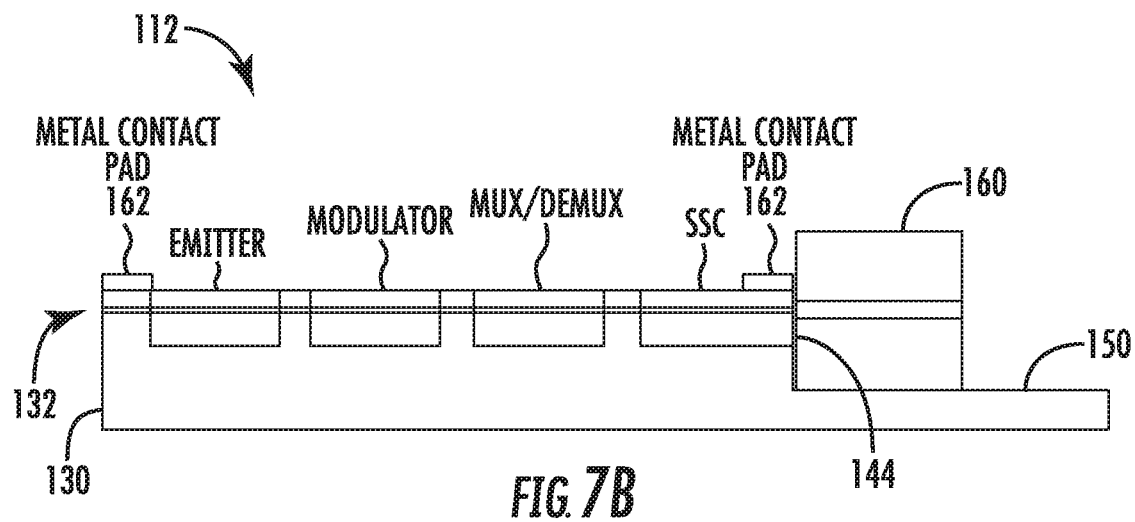
Figure 7C:
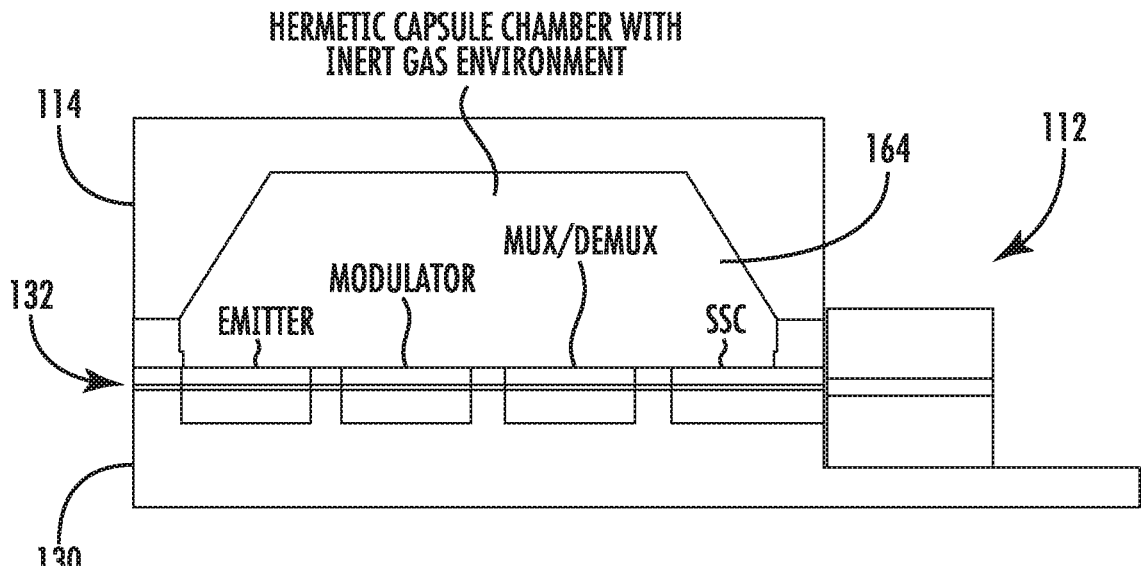

Referring to FIG. 7A, FIG. 7B, and FIG. 7C, a simplified modification is illustrated, which can be used in some specific applications. In this example, steps for fabricating a base 112, include providing a semiconductor wafer 130 and modifying base 112 by the growth of epi layers 132 to define laser/waveguide structures similar to that described in FIG. 4A above. Referring specifically to FIG. 7A, photonic devices are fabricated into epi layers 132. In this preferred embodiment the photonic devices can include any or all of an emitter/detector 136, a modulator 138, a mux/demux device 140, and spot size converter 142. Also, emitter/detector 136, in the emitter form, preferably includes a laser, such as a distributed feedback (DFB) laser, a Fabry-Perot (FB) laser, a distributed Bragg reflector (DBR) laser, a tunable laser, a VCSEL (vertical cavity surface emitting laser), or any other type of semiconductor laser. While the major components are listed above, the photonic devices can also include other components, such as modulators, detectors, mux, demux, waveguides, couplers, splitters, and spot size converters all in InP (in the preferred example). The modulator and at least some of the waveguide can be polymer based, e.g. a Mach-Zehnder structure.

Referring specifically to FIG. 7B another step in the process includes etching semiconductor wafer 130 (at the right hand side in FIG. 7B) to expose an end 144 of spot size converter 142 and to form an elongated V-shaped trench 150 for receiving an optical fiber 160 therein. In this modification, spherical lens 52, isolator 54, and lens 58 (see FIG. 4H) are not used and optical fiber 160 is butted directly against and optically aligned with end 144 of spot size converter 142. Metal contact pad 162 is formed on the peripheral area, including spot size converter 142, so as to completely surround all of the photonic devices, including all of emitter/detector 136, modulator 138, mux/demux device 140, and spot size converter 142.

Metallization of contact areas (or area) 162 is preferably performed by using evaporation, ebeam, or sputtering of the metal onto the designated surface. Referring additionally to FIG. 7C, lid 114 (as metalized in FIG. 3C, is aligned and hermetically sealed to base 112 to encapsulate and hermetically seal all of the semiconductor/polymer components. The metalized sealing can be accomplished, for example, via laser, seam, bonding, alloying, etc. A chamber 164 formed by the union of base 112 and lid 114 is preferably filled with an inert gas (e.g. nitrogen, argon, etc.) which can be introduced by aligning and sealing lid 114 in an atmosphere of the chosen inert gas.

Referring to FIG. 8A, FIG. 8B, FIG. 8C, and FIG. 8D, another modification is illustrated, which can be used in some specific applications. In this example, steps for fabricating a base 212, include providing a semiconductor wafer 230 and modifying base 212 by the growth of epi layers 232 to define laser/waveguide structures similar to that described in FIG. 4A above. Referring specifically to FIG. 7A, photonic devices are fabricated into epi layers 232. In this preferred embodiment the photonic devices can include any or all of an emitter/detector 236, a modulator 238, a mux/demux device 240, and spot size converter 242. Also, emitter/detector 236, in the emitter form, preferably includes a laser, such as a distributed feedback (DFB) laser, a Fabry-Perot (FB) laser, a distributed Bragg reflector (DBR) laser, a tunable laser, a VCSEL (vertical cavity surface emitting laser), or any other type of semiconductor laser. While the major components are listed above, the photonic devices can also include other components, such as modulators, detectors, mux, demux, waveguides, couplers, splitters, and spot size converters all in InP (in the preferred example). The modulator and at least some of the waveguide can be polymer based, e.g. a Mach-Zehnder structure.

Figure 8A:
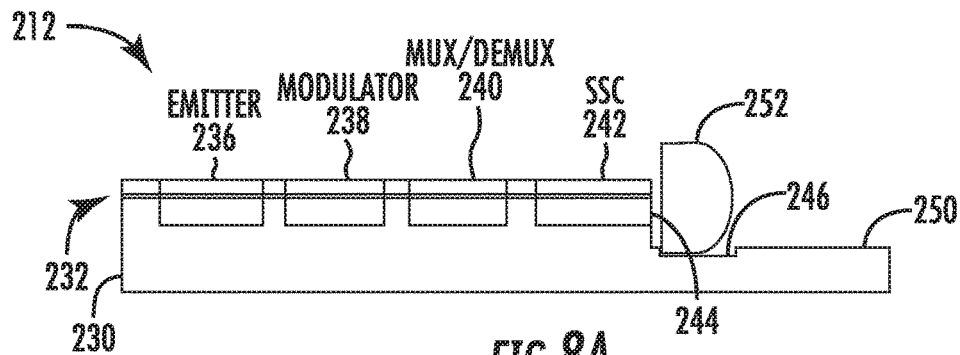
FIG. 8A through FIG. 8D illustrate steps in the process of fabricating another modification of the hermetic capsule of FIG. 1, according to the present invention.
Figure 8B:
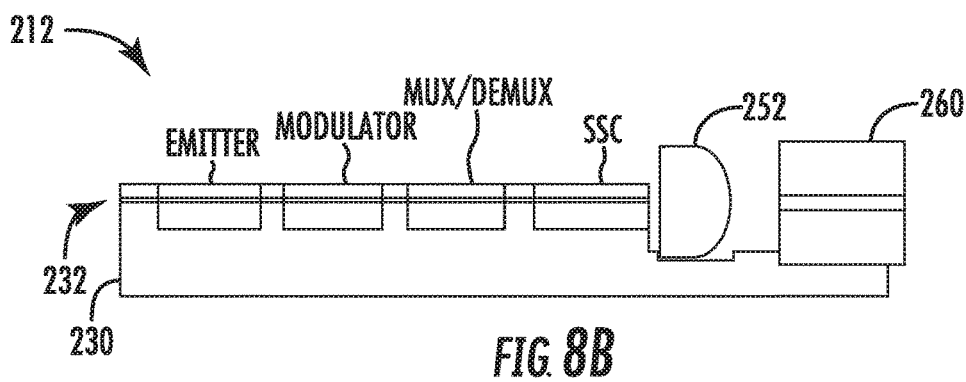

Still referring to FIG. 8A, another step in the process includes etching semiconductor wafer 230 (at the right hand side in FIG. 8A) to expose an end 244 of spot size converter 242 and to form depression 246 and to form an elongated V-shaped trench 250 for receiving an optical fiber 260 therein. In this modification, spherical lens 52, isolator 54, and lens 58 (see FIG. 4H) are not used and an optical focusing lens 252 (in the preferred example a GRIN type lens) is fixedly engaged in depression 246 and optically aligned with the output/input of spot size converter 242. As illustrated specifically in FIG. 8B, optical fiber 260 is engaged in V-shaped groove 250 and optically aligned with optical focusing lens 252.

Figure 8C:
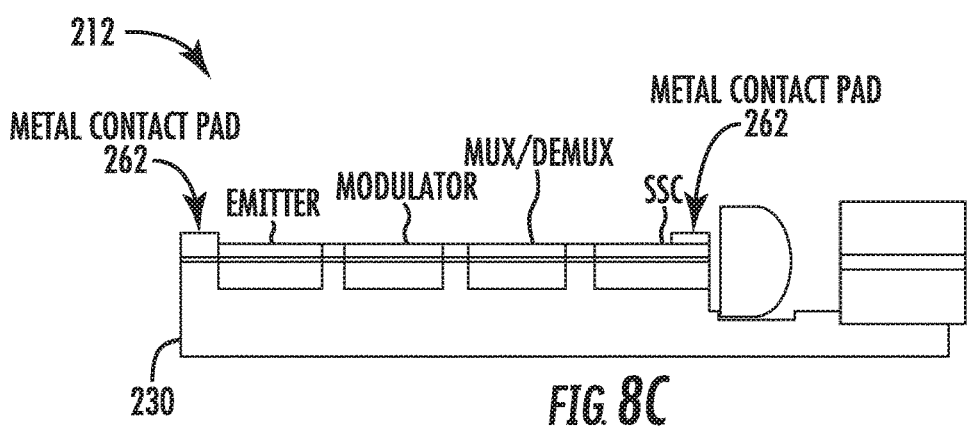
Figure 8D:
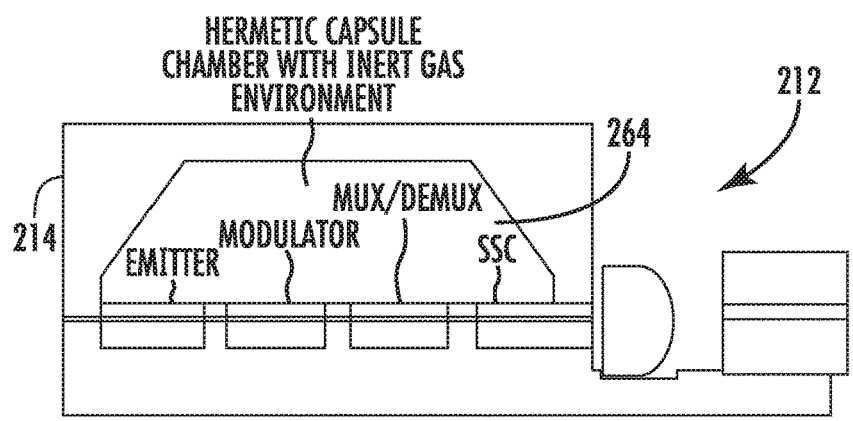

Referring specifically to FIG. 8C, metal contact pad 262 is formed on the peripheral area, including spot size converter 242, so as to completely surround all of the photonic devices, including all of emitter/detector 236, modulator 238, mux/demux device 240, and spot size converter 242. Metallization of contact areas (or area) 262 is preferably performed by using evaporation, ebeam, or sputtering of the metal onto the designated surface. Referring additionally to FIG. 8D, lid 214 (as metalized in FIG. 3C, is aligned and hermetically sealed to base 212 to encapsulate and hermetically seal all of the semiconductor/polymer components. The metalized sealing can be accomplished, for example, via laser, seam, bonding, alloying, etc. A chamber 264 formed by the union of base 212 and lid 214 is preferably filled with an inert gas (e.g. nitrogen, argon, etc.) which can be introduced by aligning and sealing lid 214 in an atmosphere of the chosen inert gas.

Figure 9:
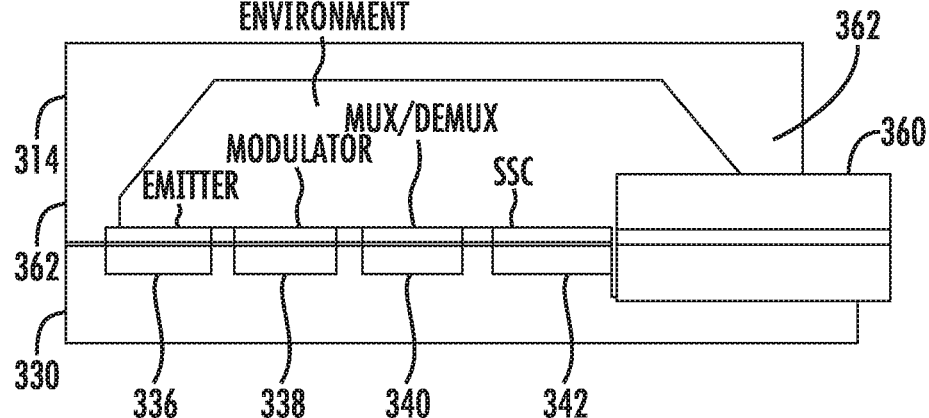
FIG. 9 illustrates another modification of the hermetic capsule of FIG. 1, according to the present invention.

A potential modification to the structure illustrated FIG. 7C, is illustrated in FIG. 9. In this modification, metal contact pad 362 is formed on the peripheral area, including optical fiber 360 (instead of spot size converter 342), so as to completely surround all of the photonic devices, including all of emitter/detector 336, modulator 338, mux/demux device 340, and spot size converter 342.

Figure 10:
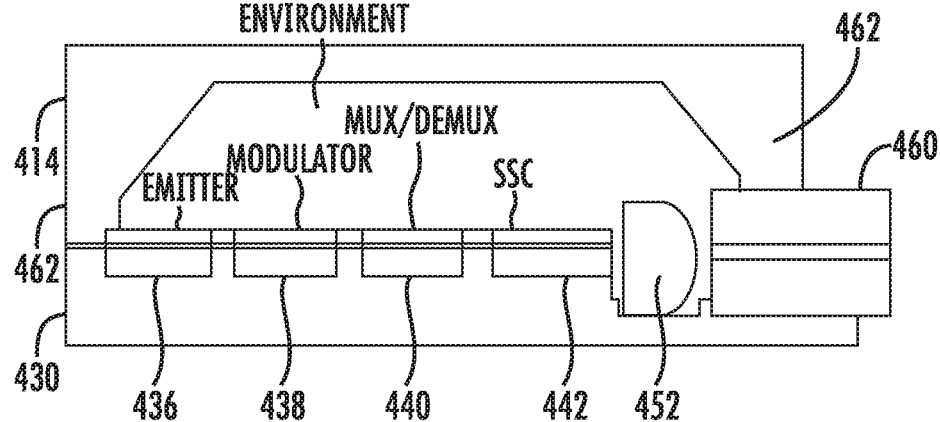
FIG. 10 illustrates another modification of the hermetic capsule of FIG. 1, according to the present invention.

A potential modification to the structure illustrated FIG. 8D, is illustrated in FIG. 10. In this modification, metal contact pad 462 is formed on the peripheral area, including optical fiber 460 (instead of spot size converter 442), so as to completely surround all of the photonic devices, including all of emitter/detector 436, modulator 438, mux/demux device 440, and spot size converter 442.

In each of the above described hermetic capsules (including all structures/modifications), the semiconductor/metal lid is sealed to the semiconductor/metal base by metallization so as to form a chamber including all sensitive semiconductor/polymer components and hermetically seal all sensitive components from the ambient. In a preferred embodiment, the lid and base are fabricated from the same or similar material so that the coefficient of temperature expansion is not a problem. In the various modifications illustrated and described, some components are added or subtracted, as preferred in different applications, and the peripheral seal between lid and base is moved to provide different sealing surfaces for different applications or metallizing procedures. In all instances the structures/modifications provide a hermetic capsule for hermetically sealing semiconductor/polymer material and especially for monolithic photonic integrated circuits (PICs) and optical components therein. In all instances the hermetic capsule provides an optical pathway for optical fiber connections and high performance signaling (both electrical and optical). Further, both the base and the lid are fabricated on a wafer scale that is cost effective.

Thus, a new and improved hermetic capsule for sealing electrical and/or optical components on a common platform is illustrated and disclosed. In a preferred embodiment, the hermetic capsule contains and hermetically seals a laser and a polymer modulator integrated on a common platform. The hermetic capsule seals sensitive components integrated on a common platform with more efficient electrical and optical coupling to the exterior. Also, fabrication of the hermetic capsule is performed in a wafer scale solution that is cost effective.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A hermetic capsule comprising:
   a semiconductor base including sensitive semiconductor and polymer electrical and optical components included in a monolithic photonic integrated circuit on the semiconductor/metal base;
   a semiconductor and/or metal lid; and
   the semiconductor and/or metal lid sealed to the semiconductor base by metallization so as to form a chamber including all of the sensitive semiconductor and polymer electrical and optical components and hermetically sealing the chamber and all sensitive components from the ambient.

2. The hermetic capsule claimed in claim 1 wherein the sensitive semiconductor and polymer electrical and optical components included in the monolithic photonic integrated circuit include one or more of an emitter or detector, a polymer modulator, a mux or demux, and a spot size converter.

3. The hermetic capsule claimed in claim 1 wherein the semiconductor and/or metal lid is a shell-like form providing edges defining a volume space within the edges and the chamber formed by sealing the semiconductor and/or metal lid to the semiconductor base including an inert gas.

4. The hermetic capsule claimed in claim 1 wherein the semiconductor base and the semiconductor and/or metal lid are formed of InP, GaAs, GaN, sapphire, or any combinations thereof.

5. The hermetic capsule claimed in claim 4 wherein the semiconductor base and the semiconductor and/or metal lid are formed of the same material.

6. The hermetic capsule claimed in claim 1 wherein the metallization sealing the semiconductor and/or metal lid to the semiconductor base defines an optical pathway coupling an optical fiber to an optical component sealed within the chamber.

7. The hermetic capsule claimed in claim 6 wherein the semiconductor base is fabricated from InP, GaAs, GaN, sapphire, or any combinations thereof and is mounted on a capsule platform fabricated from one of silicon, GaAs, metal, plastic, or any other suitable organic or inorganic material that holds the semiconductor base and optical fiber in a fixed optically aligned relationship.

8. The hermetic capsule claimed in claim 6 wherein the metallization encases a portion of one of the optical components sealed within the chamber and the optical fiber to define the optical pathway.

9. The hermetic capsule claimed in claim 6 wherein the optical pathway coupling the optical fiber to the optical component sealed within the chamber includes at least one of a spherical lens, an optical focusing lens of the GRIN type, an optical isolator, and an optical lens.

10. A hermetic capsule comprising:
    a semiconductor base including a monolithic photonic integrated circuit in the semiconductor base with a plurality of integrated sensitive semiconductor and polymer electrical and optical components, the base being fabricated on a first wafer of InP, GaAs, GaN, sapphire, or any combinations thereof;
    a semiconductor lid fabricated on a second wafer of the same material on which the base is fabricated, the lid further being fabricated in a shell-like form defining an internal volume surrounded by a peripheral edge;
    metallization on the peripheral edges of the semiconductor lid and metallization on mating peripheral areas of the semiconductor base;
    the semiconductor lid sealed to the semiconductor base by the metallization so as to form a chamber including all of the sensitive semiconductor and polymer electrical and optical components and hermetically sealing the chamber and all sensitive components from the ambient; and
    the metallization sealing the semiconductor lid to the semiconductor base defining an optical pathway coupling an optical fiber connection to an optical component sealed within the chamber.

* * * * *